United States Patent
Dedic et al.

(10) Patent No.: US 9,882,577 B2
(45) Date of Patent: Jan. 30, 2018

(54) CIRCUITRY FOR USE IN COMPARATORS

(71) Applicant: SOCIONEXT INC., Yokohama-shi, Kanagawa (JP)

(72) Inventors: Ian Juso Dedic, Northolt (GB); Prabhu Ashwin Harold Rebello, Knaphill (GB); John James Danson, Stittsville (CA)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 15/455,957

(22) Filed: Mar. 10, 2017

(65) Prior Publication Data
US 2017/0264310 A1 Sep. 14, 2017

(30) Foreign Application Priority Data
Mar. 11, 2016 (EP) .................................. 16160041

(51) Int. Cl.
*H03M 1/38* (2006.01)
*H02M 3/07* (2006.01)
*H03K 5/24* (2006.01)
*H03K 3/013* (2006.01)
*H03M 1/00* (2006.01)

(52) U.S. Cl.
CPC .............. *H03M 1/38* (2013.01); *H02M 3/07* (2013.01); *H03K 3/013* (2013.01); *H03K 5/2481* (2013.01); *H03M 1/002* (2013.01)

(58) Field of Classification Search
CPC ........ H03K 5/24; H03K 5/249; H03K 5/2481; H03K 3/013; H03M 1/38; H03M 1/002
USPC .................................................. 341/155–161
See application file for complete search history.

(56) References Cited

U.S. PATENT DOCUMENTS 5,222,002 A * 6/1993 Hase ................ G11B 20/10009
360/39
5,736,880 A * 4/1998 Bruccoleri ............ H03L 7/0896
327/157
5,821,806 A * 10/1998 Pascucci ................ G11C 16/30
327/538

(Continued)

FOREIGN PATENT DOCUMENTS

EP    0 322 915 A2    7/1989
EP    2 211 468 A1    7/2010

(Continued)

OTHER PUBLICATIONS

Extended European Search Report of related European Patent Application No. 16160041.6 dated Aug. 29, 2016.

*Primary Examiner* — Lam T Mai
(74) *Attorney, Agent, or Firm* — Arent Fox LLP

(57) ABSTRACT

There is disclosed herein charge-mode circuitry for use in a comparator to capture a difference between magnitudes of first and second input signals, the circuitry comprising: a tail node configured during a capture operation to receive a charge packet; first and second nodes conductively connectable to said tail node along respective first and second paths; and control circuitry configured during the capture operation to control such connections between the tail node and the first and second nodes based on the first and second input signals such that said charge packet is divided between said first and second paths in dependence upon the difference between magnitudes of the first and second input signals.

15 Claims, 9 Drawing Sheets

(56) References Cited

U.S. PATENT DOCUMENTS 6,137,375 A * 10/2000 Li .......................... H03B 5/04
　　　　　　　　　　　　　　　　　　　　　331/109
6,947,514 B1 * 9/2005 Kato ....................... H03L 7/113
　　　　　　　　　　　　　　　　　　　　　327/156

FOREIGN PATENT DOCUMENTS

EP　　　　2 849 345 A1　3/2015
WO　　WO 99/21278 A1　4/1999

* cited by examiner

CIRCUITRY FOR USE IN COMPARATORS

CROSS-REFERENCE TO RELATED APPLICATIONS

This application claims priority to European Patent Application No. 16160041.6, filed Mar. 11, 2016. The disclosure of the priority application is incorporated in its entirety herein by reference.

The present invention relates to circuitry useful for capturing a difference between two input signals, for example a difference between their magnitudes. Such magnitudes may be voltage levels in the case of input voltage signals for example. Such circuitry may be useful in comparators.

Comparators typically compare two voltages or currents and output a signal indicating which one of the two is the larger (or the smaller). Comparators, in particular clocked comparators, are typically used in ADC (analogue-to-digital converter) and memory circuitry.

For example, a successive approximation register (SAR) ADC typically uses a comparator in each of its sub-conversion operations. Successive-approximation conversion may be considered as one example of a conversion process which is made up of a sequence of sub-conversion operations. Such ADC circuitry (mixed-signal circuitry) may have particular use, for example, as the ADC circuitry (sub-ADC units) used at the ends of the paths in the sampling circuitry disclosed in EP-A1-2211468.

It will be appreciated that the application of comparators (and circuitry thereof) in such ADC circuitry is merely one example application, and that the circuitry disclosed herein may be applied in comparators in general or indeed in circuitry for capturing or measuring or amplifying a magnitude difference between two input signals in general.

As background, therefore, to explore the application of circuitry of the present invention in ADC circuitry, aspects of the sampling circuitry disclosed in EP-A1-2211468 will now be considered.

FIG. 1 is a schematic diagram of analogue-to-digital circuitry 40, to which the invention may be applied. Circuitry 40 comprises sampler 42, voltage-controlled oscillator (VCO) 44 as an example clock-signal generator, demultiplexers 46, ADC banks 48, digital unit 50 and calibration unit 52.

The sampler 42 is configured to perform four-way or four-phase time-interleaving so as to split the input current $I_{IN}$ by current steering into four time-interleaved sample streams A to D. For this purpose, VCO 44 is a quadrature VCO operable to output four clock signals 90° out of phase with one another, for example as four raised cosine signals. VCO 44 may for example be a shared 16 GHz quadrature VCO to enable circuitry 40 to have an overall sample rate of 64 GS/s.

Each of streams A to D comprises a demultiplexer 46 and an ADC bank 48 connected together in series as shown in FIG. 1. The sampler 42 operates in the current mode and, accordingly, streams A to D are effectively four time-interleaved streams of current pulses originating from (and together making up) input current $I_{IN}$, each stream having a sample rate one quarter of the overall sample rate. Continuing the example overall sample rate of 64 GS/s, each of the streams A to D may have a 16 GS/s sample rate.

Focusing on stream A by way of example, the stream of current pulses is first demultiplexed by an n-way demultiplexer 46. Demultiplexer 46 is a current-steering demultiplexer and this performs a similar function to sampler 42, splitting stream A into n time-interleaved streams.

The n streams output from demultiplexer 46 pass into ADC bank 48, which contains n ADC sub-units each operable to convert its incoming pulse stream into digital signals, for example into 8-bit digital values. Accordingly, n digital streams pass from ADC bank 48 to digital unit 50.

Streams B, C, and D operate analogously to stream A, and accordingly duplicate description is omitted. If n=80, circuitry 40 may be considered to comprise 320 ADC sub-units split between the four ADC banks 48.

Calibration unit 52 is connected to receive a signal or signals from the digital unit 50 and, based on that signal, to determine control signals to be applied to one or more of the sampler 42, VCO 44, demultiplexers 46 and ADC banks 48.

FIG. 2 is a schematic diagram useful for understanding the principle of operation of ADC banks 48. For simplicity, only one output 60 of the demultiplexers 46 is shown, and consequently the ADC circuitry 48 shown represents only the ADC circuitry (sub-ADC unit) required for that particular output. Similar ADC circuitry 48 (sub-ADC units) may be provided for all the outputs of the demultiplexers 46.

ADC circuitry 48 generally takes the form of a capacitance 150. As shown in FIG. 2, capacitance 150 may be variable in value, such that its value can be trimmed during calibration or during an initial setup phase. Generally speaking, capacitance 150 is employed to convert the current pulses from output 60 into voltage values $V_{OUT}$. That is, each pulse charges up capacitance 150 to a voltage proportional to the area of the pulse concerned. This is because the amount of charge in each current pulse is defined by its area ($Q=\int I\, dt$), and because the voltage across the capacitance 150 is defined by that amount of charge Q and the capacitance value C ($V=Q/C$).

The voltage $V_{OUT}$ for a particular pulse is held across capacitance 150 until the circuitry 48 is reset by reset switch 152. Whilst the voltage Van for a particular pulse is held, this analog output value can be converted into a digital output value, for example using an ADC circuit employing a successive-approximation register (SAR). In the case of differential circuitry, as may be the case for the FIG. 1 circuitry although not explicitly shown, each $V_{OUT}$ will have its complementary $V_{OUT}$, and the pair may be applied together to a differential comparator so that a single digital output for that pair is output.

An advantage of this mode of operation is that even if delays are experienced within the demultiplexers 46, the charge in each pulse will still make it to the relevant outputs, albeit over a slightly longer period. In that case, the voltage $V_{OUT}$ produced from the pulse remains unaffected. To illustrate this point, two examples 154 and 156 of the same current pulse are shown in FIG. 2. The first pulse 154 represents a case in which minimal delay is experienced. The second pulse 156 represents a case in which some delay/spreading is experienced, for example due to track capacitance in the circuitry. Consequently, pulse 156 is stretched in time as compared to pulse 154.

Importantly, the area of the two pulses 154 and 156 is substantially the same, and thus the output voltage $V_{OUT}$ would be the same for both.

FIG. 3 is a schematic diagram useful for understanding a possible application of SAR-ADC (Successive Approximation Register—Analogue-to-Digital Conversion) circuitry within each sub-ADC unit of the circuitry 48 in FIG. 6. Such circuitry could have a cycle of sub-conversion operations (phases/steps) of the form: Reset (R); Sample (S); 1; 2; 3; 4; 5; 6; 7 and 8, as shown in FIG. 3. In each Sample sub-conversion operation, a current pulse concerned may be converted into an output voltage $V_{OUT}$, and subsequently that voltage $V_{OUT}$ may be turned into an 8-bit digital value over the following 8 SAR sub-conversion operations. The next Reset sub-conversion operation then prepares the circuitry for the next current pulse.

FIG. 4 presents example SAR ADC circuitry which may be employed with the circuitry of FIGS. 1 and 2, i.e. as part of the sub-ADC units of the ADC banks 48. The main elements are a S/H circuit 170 to acquire $V_{OUT}$ from FIG. 2, a voltage comparator 180, an internal DAC 190 and an SAR 200. The comparator 180 compares the held $V_{OUT}$ with the output of the internal DAC 190 and outputs the result of the comparison to the SAR 200. The SAR 200 is designed to supply a digital code approximating $V_{OUT}$ to the internal DAC 190. The DAC 190 supplies the comparator with an analogue voltage based upon the digital code input from the SAR 200.

The SAR 200 is initialised so that its MSB is equal to digital 1 (the other bits being digital 0). This code is then input to DAC 190, whose output analogue voltage is supplied to comparator 180. If this analogue voltage is greater than $V_{OUT}$ the comparator 180 causes SAR 200 to reset this bit; otherwise, the bit is kept as a 1. Then, the next bit is set to 1 and the same procedure (sub-conversion operation) is followed, continuing this binary search until every bit in the SAR 200 has been tested (these "tests" corresponding respectively to sub-conversion operations 1 to 8 in FIG. 3). The resulting digital code output from the SAR 200 is the digital approximation of the sample voltage $V_{OUT}$ and is finally output when the conversion is complete.

It will be apparent that each such "test" involves a comparison operation performed by the comparator. Typically, such sub-conversion operations are carried out synchronously, i.e. with each sub-conversion operation taking the same amount of time as regulated by a clock signal. This may mean that each sub-conversion has a "compare" period during which the necessary comparison is carried out, and at the end of which the result of the comparison is delivered to the surrounding circuitry. This "compare" period may then be followed by a "reset" period in which the comparator is readied for the next comparison, i.e. the next sub-conversion operation. This places pressure on the comparator to consistently produce an accurate output within a given time period, even when its inputs may be very close in voltage level. The performance of the comparator affects the overall performance of the sub-ADC units and thus also of the overall analogue-to-digital circuitry 40 of FIG. 1.

It is desirable to provide circuitry which enables fast low-power low-noise comparator circuitry to be implemented. It is desirable for such circuitry to have consistent performance (e.g. over varying process, voltage, etc.). Such circuitry may be for use in a comparator, or may be for use in other types of circuitry (for example in memories).

According to an embodiment of a first aspect of the present invention, there is provided charge-mode circuitry for use in a comparator to capture a difference between magnitudes of first and second input signals. Such circuitry comprises: a tail node configured during a capture operation to receive a charge packet; first and second nodes conductively connectable to said tail node along respective first and second paths; and control circuitry configured during the capture operation to control such connections between the tail node and the first and second nodes based on the first and second input signals such that said charge packet (i.e. a current formed by said charge packet) is divided between said first and second paths in dependence upon the difference between magnitudes of the first and second input signals.

Such a charge packet is a packet of charge, i.e. a defined quantity of charge which may be referred to as a current pulse. Such circuitry may be considered charge-mode circuitry in that it relies on dividing a charge packet and on how the charge that makes up that packet is divided. Such circuitry may also be considered current-mode circuitry for similar reasons.

The charge packet or current pulse may be considered to be a defined (e.g. predetermined) or bounded or limited packet of charge, corresponding to a current signal which is limited both in time and magnitude. Such a packet of charge may result from a discontinuous or pulsed current signal, i.e. which starts and then stops to define the charge packet.

By using such a bounded packet of charge, it may be possibly to limit how much charge may flow down the first and second paths, and thus potential differences (e.g. relative to ground) caused by that charge, for example over a parasitic capacitance. Additionally, when such charge stops flowing, the potential differences may be held at least for a period of time over which they may be usefully compared. As such, the charge-mode circuitry may be for use in a comparator.

For example, the size of the charge packet may be controlled (or predetermined or defined or limited) so that an average of such potential differences (forming output signals of the charge-mode circuitry) has a defined (or predetermined) value. That value may lie between the supply (e.g. VDD) and ground (GND) voltage levels of the charge-mode circuitry, for example between 0.2 and 0.8 VDD, or between 0.5 and 0.8 VDD, or at around 0.7 VDD. Put another way, that value may lie at a level lower than a value to which such potential differences would rise to in the capture operation if an unlimited current were allowed to flow, or alternatively at a level higher than a value to which such potential differences would fall to in the capture operation if an unlimited current were allowed to flow. The size of the charge packet may be smaller than an amount of charge that would flow in the capture operation if the flow of current were not limited.

As another example, the size of the charge packet may be such that voltage levels at said first and second nodes (approach and) stabilise or settle at first and second different values during a capture operation. An average of those different values may be defined by the size of the charge packet. The difference (e.g. the size of the difference) between those values may be dependent on the difference between magnitudes of the first and second input signals.

The input signals may be voltage-mode (or simply voltage) signals with the magnitudes being voltage levels. The input signals may be current-mode (or current) signals with the magnitudes being values of current. The input signals may be charge-mode signals with the magnitudes being amounts of charge. The first and second input signals may be analogue signals. Of course, current- or charge-based signals may be converted into voltage-mode signals, and those voltage-mode signals employed as the input signals.

The control circuitry may comprise switching circuitry provided along the paths, the switching circuitry configured such that the relative conductivity of the connections between the tail node and the first and second nodes is controlled by the magnitudes of the first and second input signals. Such switching circuitry may comprise transistors, such as MOSFETs.

The switching circuitry may comprise a first transistor whose channel forms part of the first path and a second transistor whose channel forms part of the second path. The gate terminals of those transistors may be controlled by the first and second input signals, to affect the flow of current or charge along those paths.

The control circuitry may be configured to cause the charge packet or current pulse to be divided so that portions thereof pass simultaneously along the first and second paths. The relative size of those portions may be dependent on the difference between the magnitudes of the first and second input signals.

The current-mode circuitry may comprise a controllable charge pump or current source configured to provide the charge packet (or current pulse) during the capture operation. The controllable charge pump or current source may be controllable in the sense that it is possible to control when the charge packet is provided and/or the size of the charge packet.

The controllable charge pump may be configured such that the charge packet has a predetermined or given size. The controllable charge pump may be configured such that the predetermined or given size can be adjusted, for example based on a control or reference signal. The controllable charge pump may be connected such that the charge packet is delivered to the tail node during the capture operation. The given or predetermined size may be such that voltage levels at said first and second nodes settle at first and second different values during the capture operation in dependence upon the difference between magnitudes of the first and second input signals.

The controllable charge pump may comprise a capacitor and switching circuitry operable to charge the capacitor prior to the capture operation and to discharge the capacitor during the capture operation so as to provide the charge packet. The controllable charge pump may be configured in other ways. The charge pump may be configured to adjust the amount of charge in the charge packet to compensate for e.g. changes in capacitance or supply voltage.

The charge-mode circuitry may be configured to receive a clock signal (or other such control signal) and to perform the capture operation based upon the clock signal. As such, the charge-mode circuitry may be considered clocked circuitry, whose operation is synchronised with the clock signal.

The charge-mode circuitry may be configured to carry out a series of said capture operations, for example synchronised with the clock signal. Such capture operations may alternate with reset operations, during which the circuitry is reset (such as in the sense of voltage levels at the first and second nodes being brought to initial values).

Thus, the charge-mode circuitry may be configured to bring or set voltage levels at the first and second nodes to initial values (immediately) before (or for the start of) the or each capture operation.

According to an embodiment of a second aspect of the present invention, there is provided a comparator comprising charge-mode circuitry according to the aforementioned first aspect of the present invention.

Such a comparator may comprise differential-input dynamic or clocked latch circuitry, such as strongARM latch circuitry, the latch circuitry connected to receive its inputs from the charge-mode circuitry. For example, those inputs may be provided from outputs of the charge-mode circuitry, which outputs may be provided at the first and second nodes of the charge-mode circuitry. For example, those inputs may be connected to the first and second nodes of the charge-mode circuitry.

According to an embodiment of a third aspect of the present invention, there is provided analogue-to-digital converter circuitry, comprising charge-mode circuitry according to the aforementioned first aspect of the present invention, or a comparator according to the aforementioned second aspect of the present invention.

According to an embodiment of a fourth aspect of the present invention, there is provided an IC chip, such as a flip chip, comprising charge-mode circuitry according to the aforementioned first aspect of the present invention, or a comparator according to the aforementioned second aspect of the present invention, or analogue-to-digital converter circuitry according to the aforementioned third aspect of the present invention.

According to an embodiment of a fifth aspect of the present invention, there is provided a memory device, comprising charge-mode circuitry according to the aforementioned first aspect of the present invention, or a comparator according to the aforementioned second aspect of the present invention, or analogue-to-digital converter circuitry according to the aforementioned third aspect of the present invention.

The present invention extends to method aspects corresponding in scope with the apparatus aspects.

Reference will now be made, by way of example, to the accompanying drawings, of which:

FIG. 1, as mentioned above, is a schematic diagram of analogue-to-digital circuitry, to which the invention may be applied;

FIG. 2, as mentioned above, is a schematic diagram useful for understanding the principle of operation of ADC units of the FIG. 1 ADC banks;

FIG. 3, as mentioned above, is a schematic diagram useful for understanding a possible application of SAR-ADC circuitry within each sub-ADC unit of FIG. 2;

FIG. 4, as mentioned above, is a schematic diagram of example SAR ADC circuitry which may be employed with the circuitry of FIGS. 1 and 2, as part of the sub-ADC units;

Figure 5:
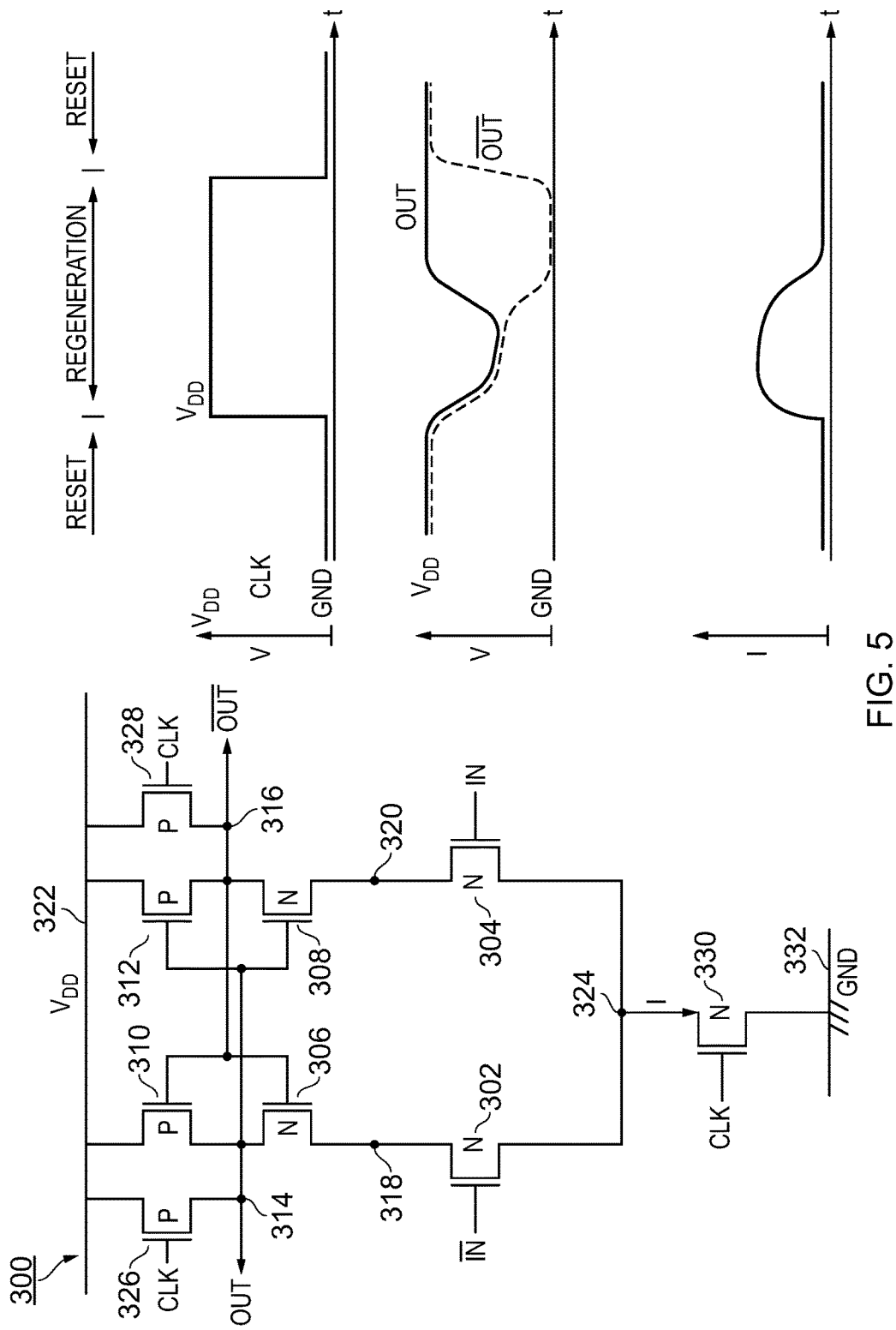
FIG. 5 is a schematic diagram of previously-considered example clocked comparator circuitry.

FIG. 5 is a schematic diagram of previously-considered example clocked comparator circuitry 300. Clocked comparator circuitry 300 may be referred to as latched comparator circuitry 300, and may be compared to latch circuitry known generically as a strongARM latch. The operation of the circuitry can be understood by the graphs provided and alongside and commented on in more detail below.

Circuitry 300 comprises a differential pair of input transistors 302 and 304, two cross-coupled pairs of transistors 306, 308, 310 and 312, output nodes 314 and 316, intermediate nodes 318, 320, a first reference voltage source 322, a tail node 324, clocked precharge transistors 326 and 328, a clocked "compare" transistor 330 and a second reference voltage source 332, connected together as in FIG. 5.

Figure 4:
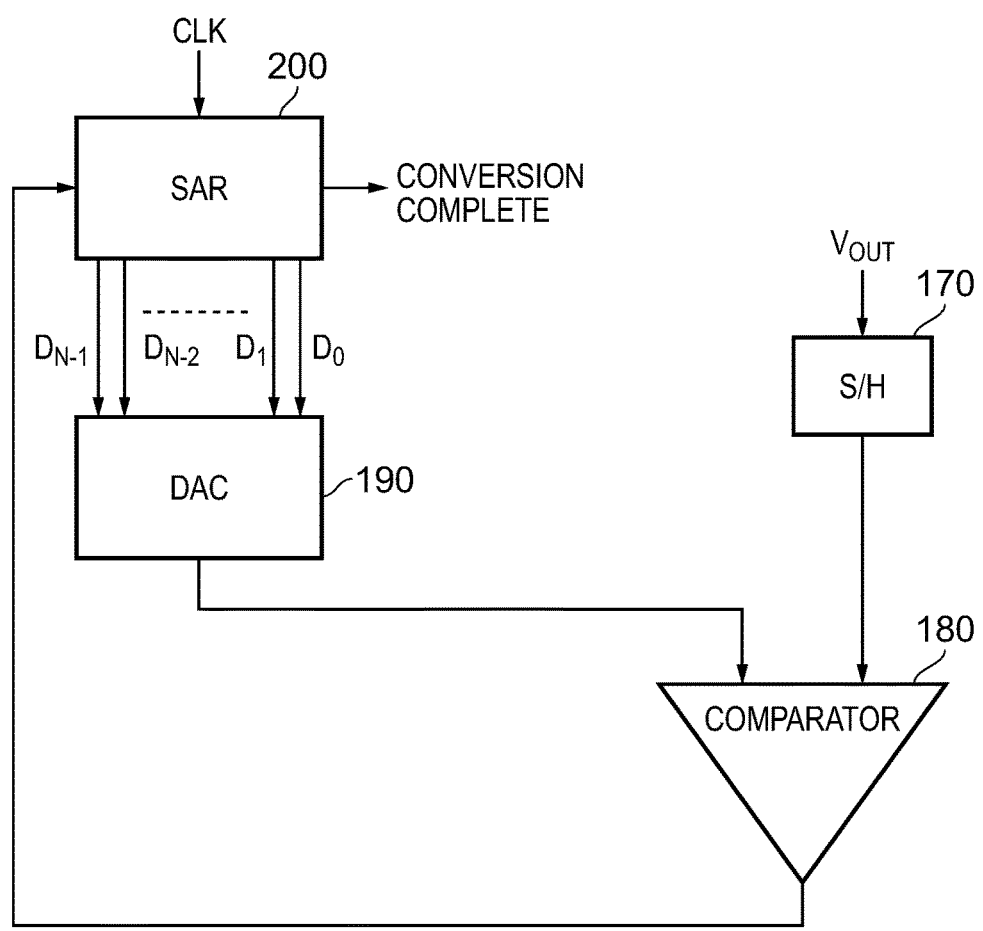

More specifically, the differential pair of input transistors 302 and 304 are connected such that their gate terminals serve as a pair of differential inputs receiving input signals IN and /IN. These are the two comparator inputs to be compared to one another (see e.g. the two inputs to comparator 180 in FIG. 4).

The two cross-coupled pairs of transistors 306, 308, 310, 312 are coupled to form two cross-coupled inverters, with transistors 306 and 310 forming one of the inverters with its output connected to output node 314, and with transistors 308 and 312 forming the other one of the inverters with its output connected to output node 316. The inverter formed by transistors 306 and 310 is connected between the intermediate node 318 and the first reference voltage source 322, in this case VDD. The inverter formed by transistors 308 and 312 is connected between the intermediate node 320 and the first reference voltage source 322. The outputs of the inverters provide the outputs, at output nodes 314 and 316, of the comparator circuitry 300.

The differential pair of input transistors 302 and 304 are connected respectively between the intermediate nodes 318 and 320 and the common tail node 324.

The precharge (or reset) transistors 326 and 328 are respectively connected between the output nodes 314 and 316 and the first reference voltage source 322. The compare (or regeneration) transistor 330 is connected between the common tail node 324 and the second reference voltage source 332, in this case ground (GND). The precharge transistors 326 and 328 and the compare transistor 330 are connected to receive a clock signal CLK, in this case a switched logic level (e.g. square wave) signal alternating between logic high (VDD) and logic low (GND), as indicated in the relevant graph.

The transistors 302, 304, 306, 308 and 330 are NMOS MOSFETs, and the transistors 310, 312, 326 and 328 are PMOS MOSFETs.

In operation, the circuitry operates in alternating "reset" (when clock signal CLK is low) and "regeneration" (when clock signal CLK is high) phases in synchronisation with the clock signal CLK, as will be appreciated from the graphs in FIG. 5. Regeneration phases may be referred to as "compare" or, particularly in the light of circuitry disclosed later herein, as "capture" phases.

In the "reset" phase when the clock signal CLK is low, the precharge transistors 326 and 328 are on and pull the output nodes 314 and 316 to logic high or VDD. At this time, the compare transistor 330 is off, preventing current from flowing through e.g. the intermediate nodes 318 and 320.

As soon as the clock signal CLK goes high for the regeneration phase, the precharge transistors 326 and 328 turn off and the compare transistor 330 turns on. Importantly, the input transistors 302 and 304 are also on to a differing degree if their input signals (the comparator inputs) are slightly different from one another, as they inevitably would be (if only slightly).

The voltage levels at output nodes 314 and 316 fall as the current begins to flow, but because the transistors 302 and 304 are inevitably on to differing degrees (in practice they will not be on to exactly the same degree) the differing currents flowing through the intermediate nodes 318 and 320 cause one of these voltages to drop (perhaps only slightly) faster than the other. The cross-coupled inverters serve to accelerate and amplify this difference (in the sense of increasing the difference, at an increasing rate) causing the voltage level at one of the output nodes to drop to logic low or ground (GND) and the voltage level at the other output node to rise again to logic high or VDD. This operation, and the associated flow of current through common tail node 324, can be appreciated from the graphs in FIG. 5.

Which of the output nodes 314 and 316 goes to logic high and which goes to logic low depends on (in the ideal case, in the absence of e.g. noise) which of the input signals IN and /IN is larger, so that the voltage levels of the output signals OUT and /OUT provide the comparison result at the end of that regeneration phase. The accuracy of the circuitry 300 is therefore dependent on the correct "decision" being taken when the voltage levels at the output nodes 314 and 316 diverge under acceleration of the cross-coupled inverters.

Of course, when the next "reset" phase starts i.e. when the clock signal CLK goes low, the precharge transistors 326 and 328 turn back on and the compare transistor 330 turns back off, stopping the flow of current (such that there is no static current) and precharging the output nodes 314 and 316 to logic high or VDD again.

It will therefore be appreciated that the clocked comparator circuitry 300 serves to perform a comparison operation per clock cycle, in particular during each regeneration phase when the clock signal CLK is high, the comparison operation comparing the voltage levels of the input signals IN and /IN at that time and giving output signals OUT and /OUT which are either logic high and logic low or vice versa depending (ideally) on which of the input signals IN and /IN has the higher voltage level.

As explained above, this action is dominated by the cross-coupled inverters in the upper half of the circuitry 300. Based on the difference between the input signals IN and /IN, one of the inverters will start pulling in a particular direction slightly quicker than the other because of the difference between the currents which initially flow through the transistors 302 and 304 at the input. This will cause the two inverters to accelerate/amplify the difference between the two sides, with their outputs rapidly diverging. Like CMOS inverter circuitry the supply current only flows while the circuitry is active.

The circuitry 300 has disadvantages. The inventors have in particular considered desired high-speed operation, for example with each regeneration phase lasting only 10 to 50 ps. They have also considered low power operation, e.g. with VDD being 1V or even lower. A challenge is that for the input transistors 302 and 304 to be low-noise contributors they would be sized to be relatively big, however this slows their operation (high capacitance).

The circuitry 300 may be considered to have the following disadvantages, namely: (1) it is sensitive to common-mode input voltage; (2) it is sensitive to variation in device $V_{TH}$—for example, in respect of the input transistors 302 and 304; (3) it has relatively poor noise performance—many transistors contribute to the noise, with those transistors being small in order to switch quickly; and (4) it is sensitive to changes in the input signals IN and /IN after the clock edge.

Figure 6:
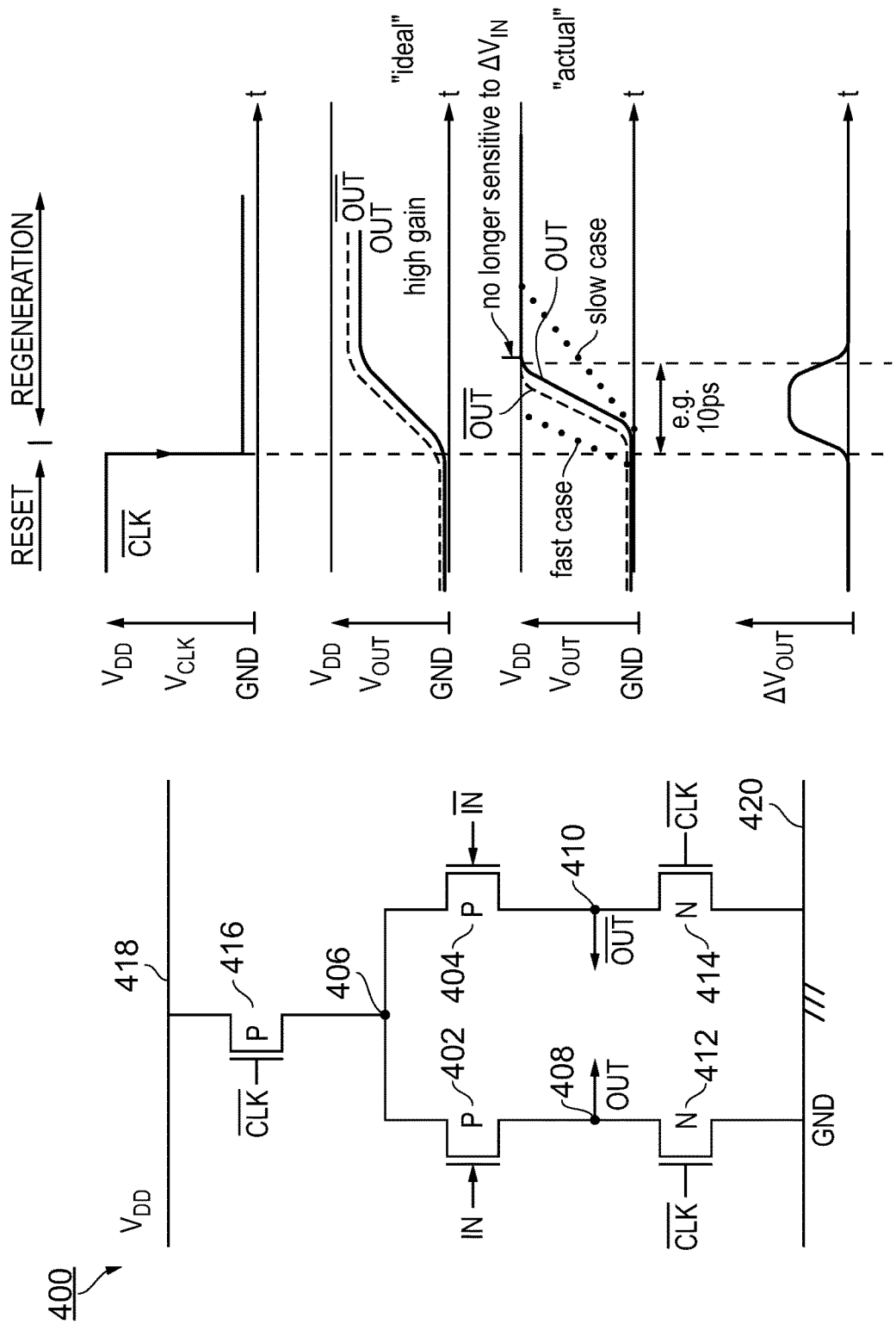
FIG. 6 is a schematic diagram of previously-considered example clocked pre-amplifier circuitry for use with the circuitry of FIG. 5.

FIG. 6 is a schematic diagram of previously-considered example clocked pre-amplifier circuitry 400, for use with the clocked comparator circuitry 300. The operation of this circuitry 400 can be understood from the graphs provided alongside and commented on in more detail below, as for circuitry 300.

Circuitry 400 comprises a differential pair of input transistors 402 and 404, a common tail node 406, intermediate nodes 408 and 410, clocked transistors 412, 414 and 416, a first reference voltage source 418 and a second reference voltage source 420, connected together as in FIG. 6.

More specifically, the differential pair of input transistors 402 and 404 are connected such that their gate terminals serve as a pair of differential inputs receiving input signals IN and /IN. As before, these are the two comparator inputs to be compared with one another (see e.g. the two inputs to comparator 180 in FIG. 4). However, the clocked pre-amplifier circuitry 400 is for use with the clocked comparator circuitry 300 such that the output signals OUT and /OUT of the circuitry 400 (mentioned below) become the input signals IN and /IN in circuitry 300.

The input transistors 402 and 404 are connected between the common tail node 406 and the intermediate nodes 408 and 410, respectively. The clocked transistors 412 and 414 are respectively connected between the intermediate nodes 408 and 410 and the second reference voltage source 420, in this case ground (GND). The clocked transistor 416 is connected between the common tail node 406 and the first reference voltage source 418, in this case VDD. The ground and VDD levels between circuitry 300 and 400 may be the same but this is of course not essential.

The clocked transistors 412, 414 and 416 are connected to receive the clock signal /CLK, i.e. the inverse of the clock signal CLK in FIG. 5. Transistors 412 and 414 are NMOS MOSFETs and transistors 402, 404 and 416 are PMOS MOSFETs.

The intermediate nodes 408 and 410 provide the output signals OUT and /OUT to the transistors 304 and 302 in FIG. 5 as already mentioned.

In operation, the circuitry 400 operates based on the clock signal /CLK and thus for ease of comparison the "reset" and "regeneration" phases from FIG. 5 are shown for the graphs of FIG. 6. Note that both "ideal" and "actual" cases are indicated for the output signals OUT and /OUT ($V_{OUT}$). The "actual" case corresponds to the circuitry 400 and the "ideal" case will be commented on later in connection with FIGS. 7 to 9.

In the "reset" phase, when the clock signal /CLK is high (and the clock signal CLK is low), the clocked transistors 412 and 414 are off and the clocked transistor 416 is on. Thus, as with a CMOS inverter, the output signals OUT and /OUT at nodes 408 and 410 are at logic low or ground (GND). In the "regeneration" phase, when the clock signal /CLK is low, the clocked transistors 412 and 414 are off and the clocked transistor 416 is on. Thus, again in line with a CMOS inverter, the output signals OUT and /OUT at nodes 408 and 410 both rise up to logic high or VDD.

The voltage levels of the input signals IN and /IN control the degree to which transistors 402 and 404 are on, and during the regeneration phase this controls the current flowing through nodes 408 and 410 and consequently how quickly the voltage levels at those nodes rise up to logic high, i.e. up to the same voltage level. An example is shown in the "actual" graph in FIG. 10, with the output signal /OUT rising up to VDD quicker than the output signal OUT, and with there being a corresponding difference in voltage $\Delta V_{OUT}$ between these output signals OUT and /OUT for the short period of time indicated in the lower-most graph. This period could for example be as short as 10 ps, given the example regeneration phase of only 10-50 ps mentioned earlier. It will be appreciated that the clocked pre-amplifier circuitry 400 can provide an amplified voltage difference $\Delta V_{OUT}$ at the input terminals (i.e. between input signals IN and /IN) of the circuitry 300 of FIG. 5, i.e. bigger than the voltage difference between the input signals IN and /IN of the circuitry 400 of FIG. 6 which would otherwise be provided directly to the circuitry 300 (i.e. in the absence of circuitry 400). This amplification provides some noise performance benefit, but there are disadvantages.

These advantages and disadvantages will now be explored further.

An advantage of the clocked pre-amplifier circuitry 400 of FIG. 6 is that its gain has a knock-on effect of a noise reduction in the overall circuitry including the circuitry 300 of FIG. 5 and the circuitry 400 of FIG. 6. For example, a gain of 3 in the clocked pre-amplifier circuitry 400 would lead to a noise reduction of the latch circuitry 300 by a factor of 3. Also, the PMOS transistors 402 and 404 at the inputs of the FIG. 6 circuitry 400 can be made big (low noise) without slowing down the regeneration.

Disadvantages associated with the FIG. 6 circuitry are indicated in the graphs on the right-hand side of FIG. 6.

In the "ideal" case, the output signals OUT and /OUT would rise (with gain) dependent on the input signals IN and /IN when the clock signal /CLK goes low, and then maintain their values until the subsequent rising clock edge. However, because the uppermost PMOS transistor 416 stays on when the clock signal /CLK is low, the "actual" situation corresponding to circuitry 400 as mentioned above is that the output signals OUT and /OUT rise quickly up to logic high or VDD (i.e. such that they settle at the same voltage levels) with some variation in how quickly this occurs dependent on the current flowing through the uppermost PMOS transistor 416 (i.e. dependent on the common mode voltage $V_{CM}$, the threshold voltages $V_{TH}$ of the input NMOS transistors or switches 402 and 404 and the threshold voltage $V_{TH}$ of the uppermost PMOS transistor 416). Example "fast" and "slow" cases are indicated in the "actual" graph in FIG. 10.

Thus, the amplified $\Delta V_{OUT}$ signal (difference between the output signals OUT and /OUT) as indicated in the lower most graph in FIG. 6 may indicate a difference only for a very short period of time (e.g. 10 ps) before it indicates no difference at all, with that profile varying with how quickly the output signals OUT and /OUT are pulled to logic high or VDD. This voltage then may have disappeared before the latch circuitry 300 of FIG. 5 has had time to respond to it by regenerating. This also means that the effective pre-amplifier gain of the circuitry 400 has fallen so that it no longer reduces the noise of the latch circuitry 300.

Thus, although the FIG. 6 circuitry helps to address the disadvantages (3) and (4) discussed above, it brings with it its own disadvantages (e.g. a disadvantage (5) being that the voltage difference $\Delta V$ between the input signals IN and /IN of circuitry 300 disappears as $\Delta V_{OUT}$ disappears for circuitry 400) and the disadvantages (1) and (2) discussed above remain.

Figure 7:
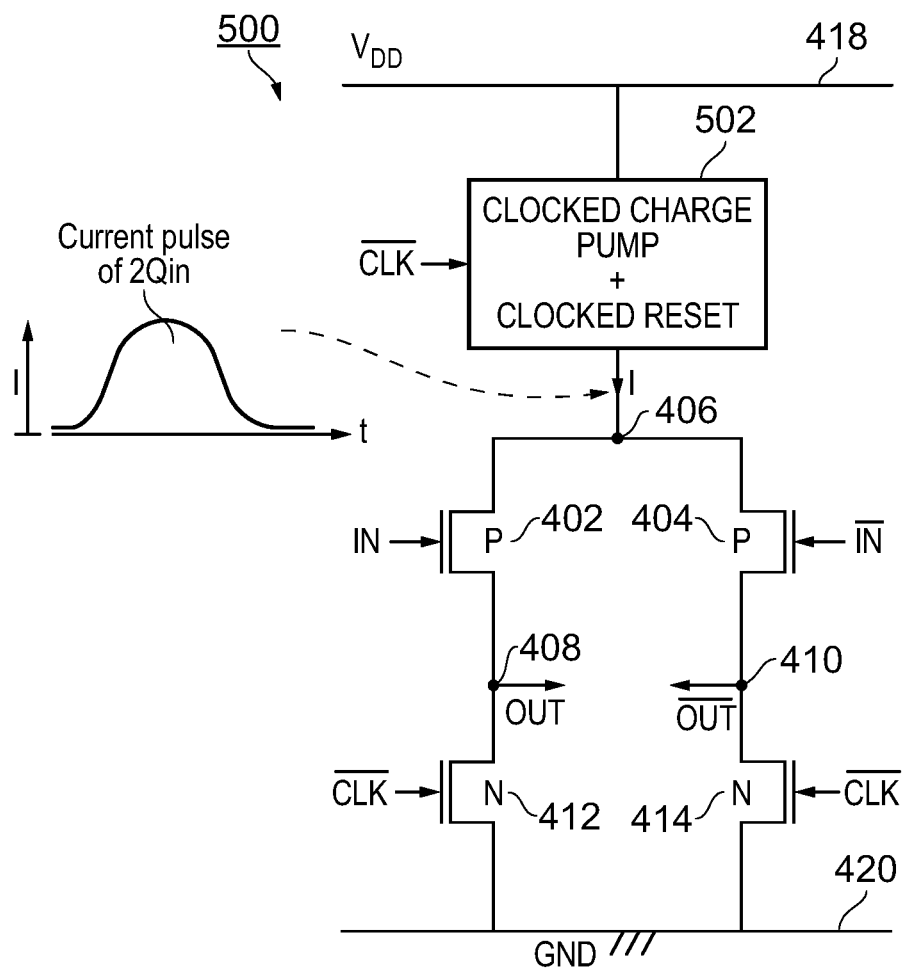
FIG. 7 is a schematic diagram of clocked pre-amplifier circuitry embodying the present invention.
Figure 8:
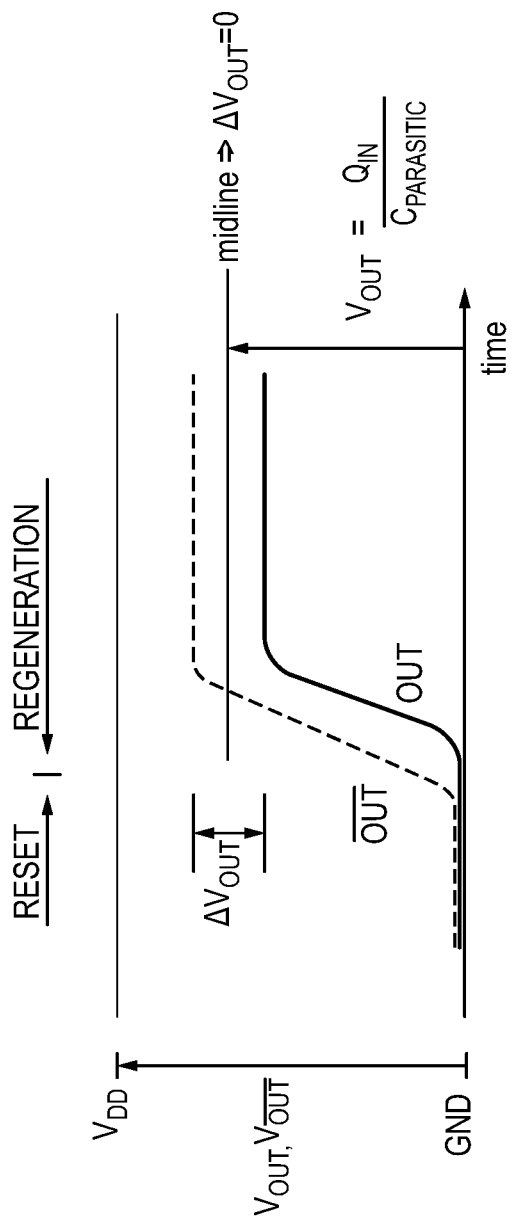
FIG. 8 is a graph useful for understanding the operation of the FIG. 7 circuitry.

FIG. 7 is a schematic diagram of improved clocked pre-amplifier circuitry 500 embodying the present invention. The operation of this circuitry 500 can be understood from the graph of FIG. 8 described below. It will be noted that the graph of FIG. 8 is similar to the "ideal" case shown in FIG. 6.

Circuitry 500 is similar to circuitry 400, and thus like elements are denoted in the same way and duplicate description is omitted. Circuitry 500 differs from circuitry 400 in that the clocked transistor 416 has been replaced with a clocked unit 502 which has a charge pump and reset function.

The general idea is to meter the charge during the regeneration phases which is then split at the common tail node 406 based on the input signals IN and /IN, so that the output voltages of the output signals OUT and /OUT at the nodes 408 and 410 will rise up to around a given "designed" target level and not continue to rise up to VDD. This is indicated in FIG. 8, with the output signals OUT and /OUT rising up towards VDD but levelling out either side of a midline value at which both would be expected to level out if the input signals IN and /IN are equal. A clocked charge pump is schematically shown by way of unit 502 connected between the common tail node 406 and the first reference voltage source 418, i.e. VDD. This unit 502 also has the function to reset the voltage at the common tail node 406 in the reset phases.

As indicated in FIG. 7, it is possible to design the charge pump aspect of unit 502 to deliver a fixed amount of charge 2Qin, understanding that if this charge splits equally at the tail node than an amount of charge Qin will be delivered to the outputs OUT and /OUT and generate a voltage ($V_{OUT}=Q_{IN}/C_{PARASITIC}$) over the effective parasitic capacitances ($C_{PARASITIC}$) of the inputs to the latch circuitry 300. This would correspond to both of the output signals OUT and /OUT levelling out at the midline value mentioned above. This fixed amount of charge $2Q_{IN}$ could for example be designed to deliver midline value $V_{OUT}$=circa 0.7 VDD, or whatever voltage is optimum for the best operation of the latch circuitry 300 of FIG. 5.

Naturally, with the difference between the input signals IN and /IN, the charge $2Q_{IN}$ would not split equally at the common tail node 406 leading to a $\Delta V_{OUT}$ (difference between the output signals OUT and /OUT as indicated in FIG. 8. That is, the voltage levels of output signals OUT and /OUT settle at different values dependent on the input signals IN and /IN. Advantageously, this $\Delta V_{OUT}$ is maintained or held because the output signals OUT and /OUT do not continue to rise to VDD as in the "actual" case in FIG. 6. Also, because the circuitry operates based on splitting charge rather than current per se, it is not sensitive to common mode voltage $V_{CM}$ and threshold voltage $V_{TH}$. Thus, this circuitry addresses all of the disadvantages (1) to (5) discussed above.

Figure 9:
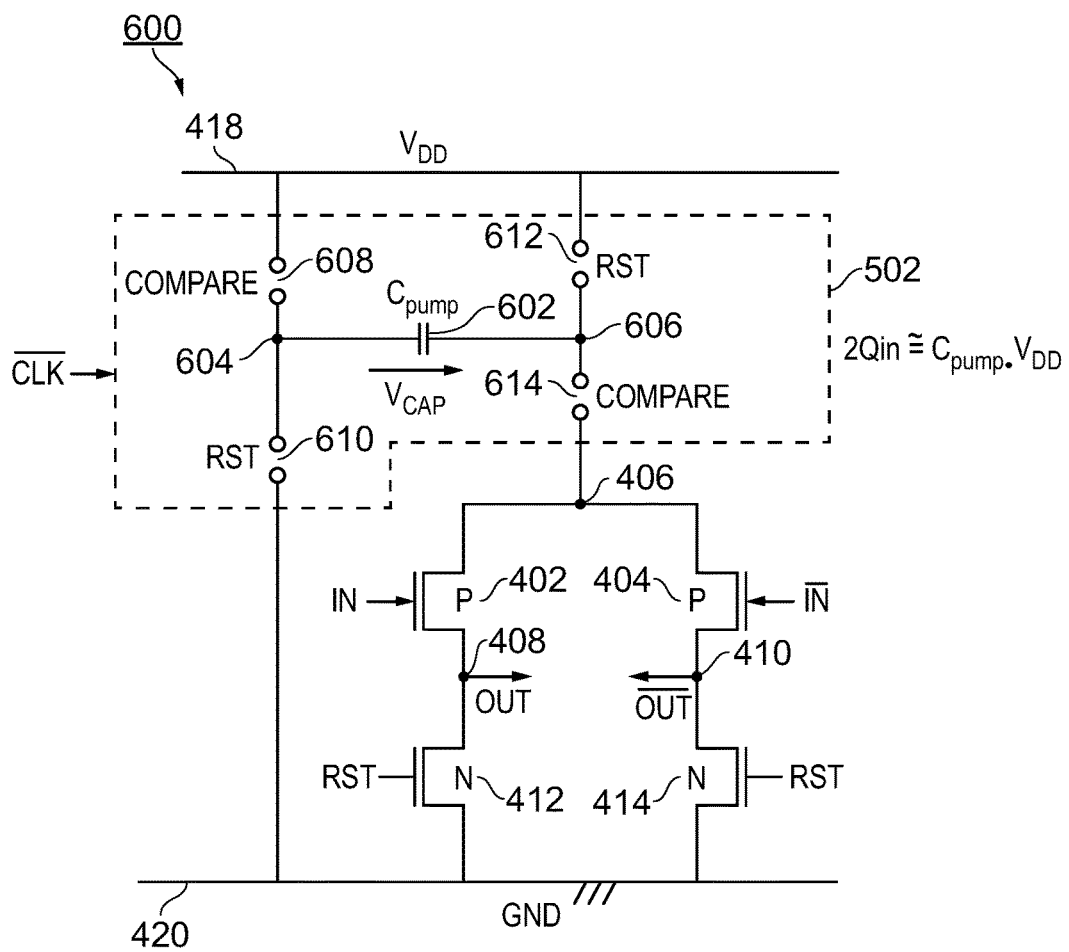
FIG. 9 is a schematic diagram of clocked pre-amplifier circuitry embodying the present invention.

FIG. 9 is a schematic diagram of clocked pre-amplifier circuitry 600 corresponding to the circuitry 500 of FIG. 7. The operation of this circuitry also corresponds to that shown in FIG. 8.

Circuitry 600 is similar to circuitry 500 and thus like elements are denoted in the same way and duplicate description is omitted. Circuitry 600 differs from circuitry 500 in that an example implementation of clocked unit 502 is explicitly shown.

Clocked unit 502 of circuitry 600 comprises a capacitor $C_{PUMP}$ 602 connected between nodes 604 and 606. Node 604 is connected via a "compare" switch 608 to the first reference voltage source 418 "VDD" and via a "reset" switch (RST) 610 to the second reference voltage source 420 ground (or GND). Node 606 is connected via a "reset" switch 612 to the first reference voltage source 418 and via a "compare" switch 614 to the common tail node 406.

The "compare" switches are configured to be closed (conductive) during the "regeneration" ("compare" or "capture") phases and open during the "reset" phases. Conversely, the "reset" (RST) switches are configured to be open during the "regeneration" phases and closed during the "reset" phases. Any suitable arrangement of clocked NMOS or PMOS transistors could be employed to provide the function of such "compare" and "reset" switches.

During the "reset" (RST) phase, the voltage $V_{CAP}$ over the capacitor (or capacitance) $C_{PUMP}$ 602 is equal to VDD because the left- and right-hand ends of the capacitor $C_{PUMP}$ 602 are effectively connected to ground 420 and VDD 418, respectively. During the "regeneration" phases, the voltage $V_{CAP}$ becomes $V_{TAIL}$ minus VDD, where $V_{TAIL}$ is the voltage at the common tail node 406 (at the end of the regeneration phase), because the left- and right-hand ends of the capacitor $C_{PUMP}$ 602 are effectively connected to VDD 418 and the common tail node 406, respectively. The value of the capacitor $C_{PUMP}$ 602 can thus be set to obtain a given charge $2Q_{IN}$ as explained before. Also, this value is dominated by VDD, hence the lower sensitivity to threshold voltage $V_{TH}$ and common mode voltage $V_{CM}$.

Incidentally, the capacitor $C_{PUMP}$ 602 could be connected via "compare" switch 608 to a separate reference voltage source $V_{REF}$ (not shown) rather than to VDD 418, and that separate reference voltage source $V_{REF}$ then adjusted to remove variation in the values of $C_{PUMP}$, VDD, $V_{TH}$, $V_{CM}$, and the second-stage input voltage (i.e. of the latch circuitry 300 of FIG. 5).

It will be recalled that the circuitry 500 or 600 could be used in conjunction with latch circuitry such as circuitry 300 of FIG. 5 to provide a comparator. Such a comparator may operate without suffering from the problems (1) to (5) mentioned above, and thus is considered advantageous.

Figure 1:
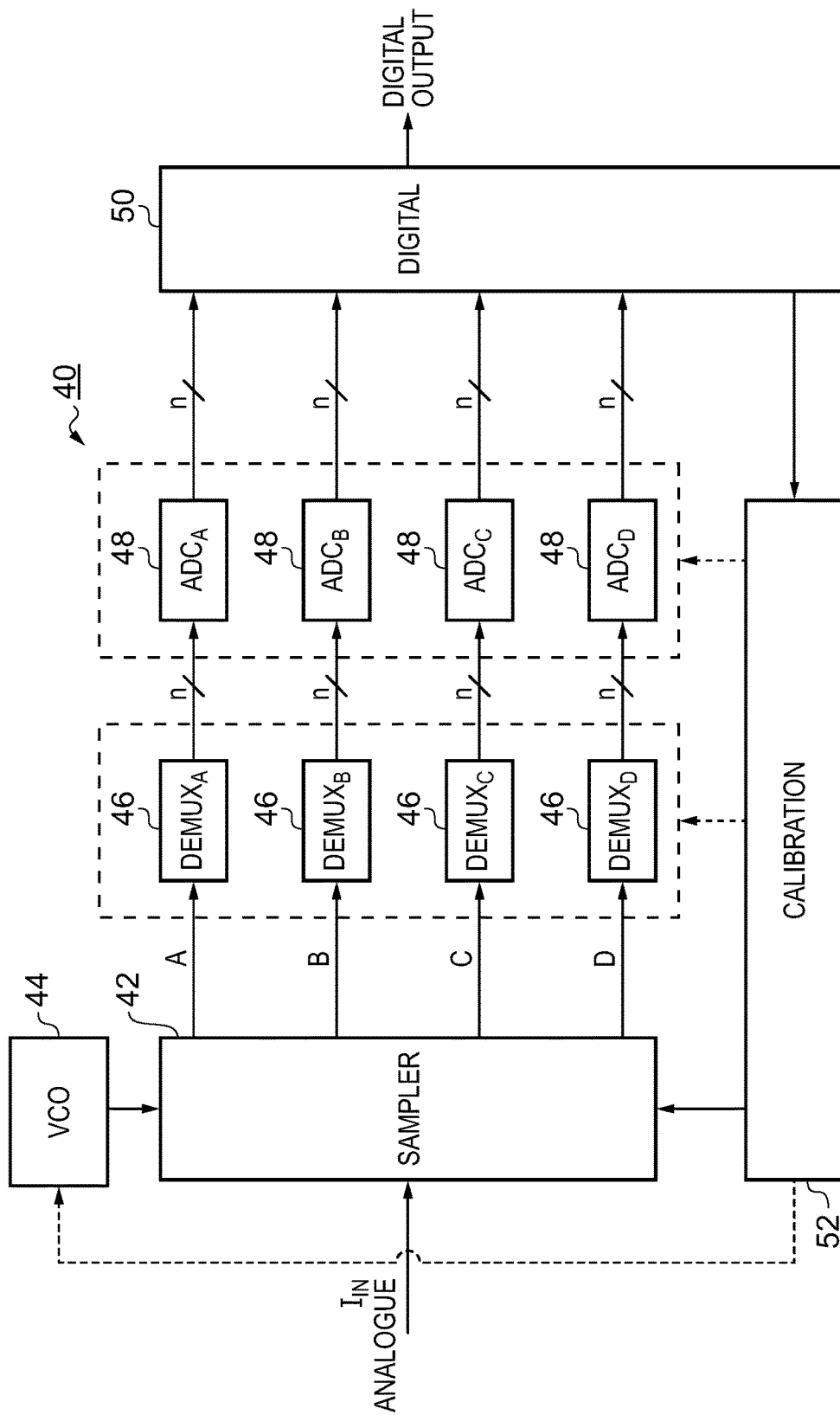
Figure 2:
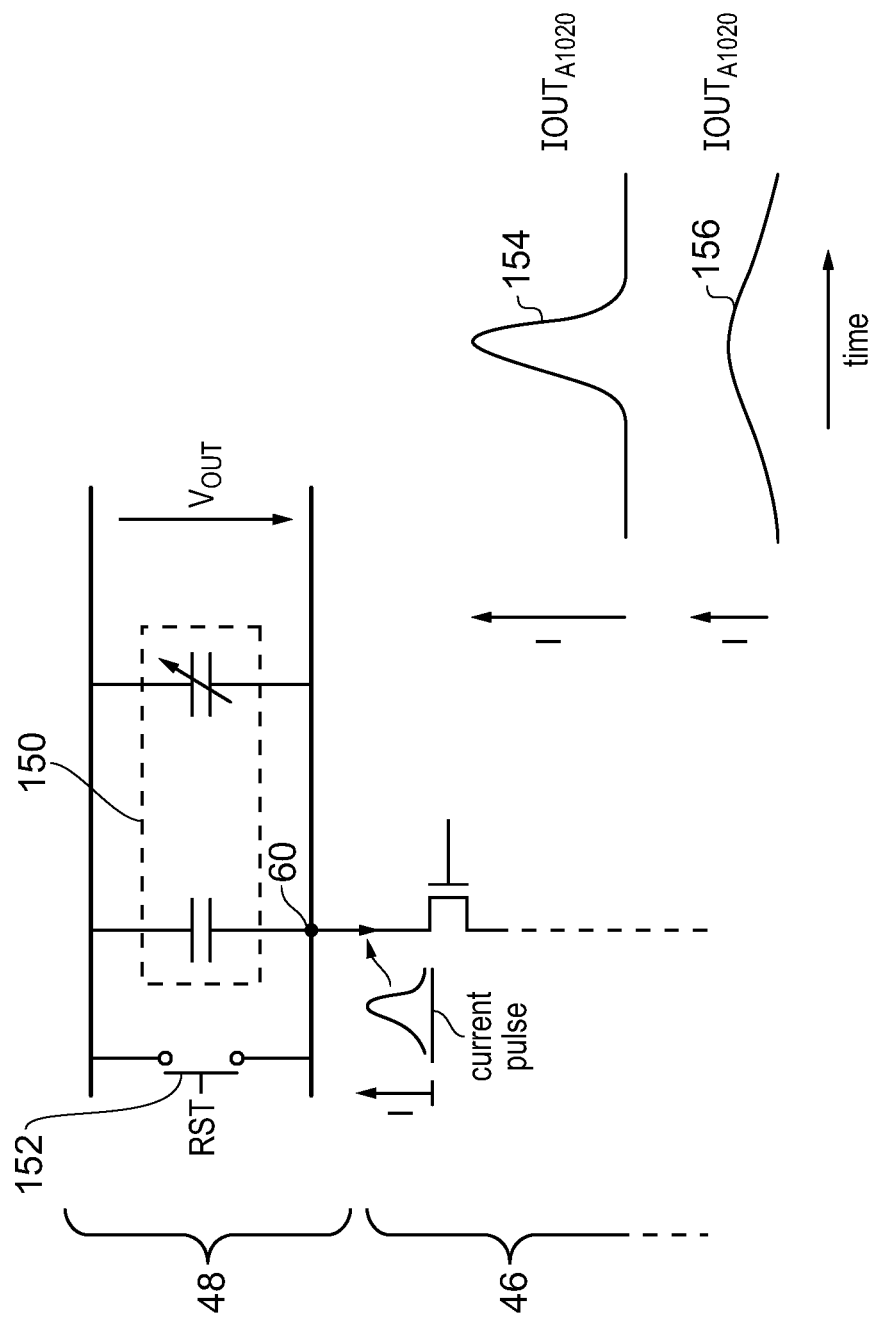
Figure 3:
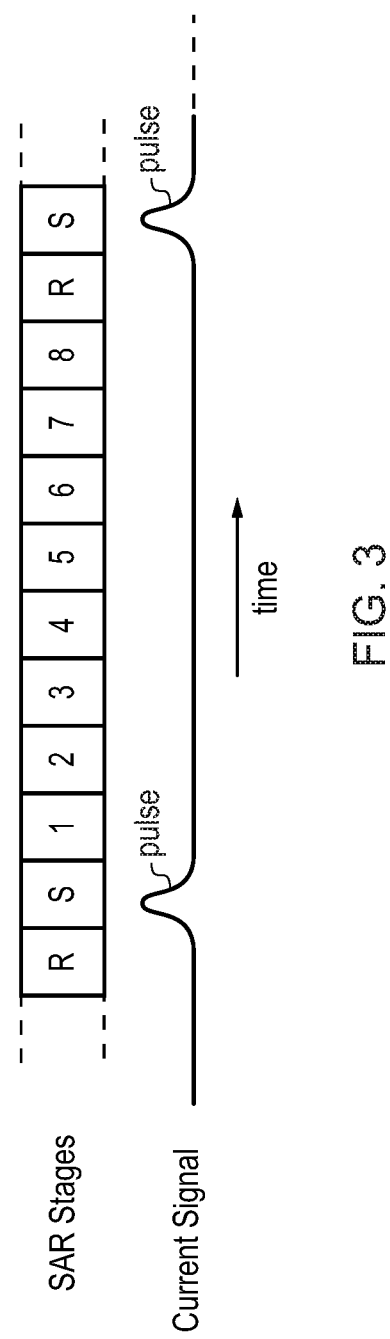

Such a comparator could be employed in ADC circuitry, for example to form a sub-ADC unit suitable for use in the ADC circuitry 40 of FIG. 1. Embodiments of the present invention therefore extend to charge-mode circuitry for capturing a difference between input voltage signals as in the case of circuitry 500 and 600, to comparator circuitry, and to ADC circuitry.

It will therefore be appreciated that the circuitry disclosed herein could be described as circuitry for use in a comparator, as a comparator itself, or as an ADC. Circuitry of the present invention may be implemented as integrated circuitry, for example on an IC chip such as a flip chip. The present invention extends to integrated circuitry and IC chips as mentioned above, circuit boards comprising such IC chips, and communication networks (for example, internet fiber-optic networks and wireless networks) and network equipment of such networks, comprising such circuit boards.

The present invention may be embodied in many different ways in the light of the above disclosure, within the spirit and scope of the appended claims.

The invention claimed is:

1. Charge-mode circuitry for use in a comparator to capture a difference between magnitudes of first and second input signals, the circuitry comprising:
   a tail node configured during a capture operation to receive a charge packet;
   first and second nodes conductively connectable to said tail node along respective first and second paths; and
   control circuitry configured during the capture operation to control such connections between the tail node and the first and second nodes based on the first and second input signals such that said charge packet is divided between said first and second paths in dependence upon the difference between magnitudes of the first and second input signals,
   wherein:
   the circuitry comprises a controllable charge pump configured to provide said charge packet during said capture operation;
   the controllable charge pump is configured such that said charge packet has a given or predetermined size; and
   the controllable charge pump is configured to control said given or predetermined size, and the given or predetermined size is such that voltage levels at said first and second nodes settle at first and second different values during the capture operation in dependence upon the difference between magnitudes of the first and second input signals.

2. The charge-mode circuitry according to claim 1, wherein:
   the input signals are voltage-mode signals and the magnitudes are voltage levels; or the input signals are current-mode signals and the magnitudes are values of current; or the input signals are charge-mode signals and the magnitudes are amounts of charge; or the first and second input signals are analogue signals.

3. The charge-mode circuitry according to claim 1, wherein the control circuitry comprises switching circuitry provided along said paths, the switching circuitry configured such that the conductivity of the connections between the tail node and the first and second nodes is controlled by the magnitudes of the first and second input signals.

4. The charge-mode circuitry according to claim 3, wherein the switching circuitry comprises a first transistor whose channel forms part of the first path and a second transistor whose channel forms part of the second path, and wherein gate terminals of those transistors are controlled by the first and second input signals.

5. The charge-mode circuitry according to claim 1, wherein the control circuitry is configured to cause the charge packet to be divided so that portions thereof pass simultaneously along said first and second paths, the relative size of those portions being dependent on the difference between the magnitudes of the first and second input signals.

6. The charge-mode circuitry according to claim 1, wherein the controllable charge pump is connected such that said charge packet is delivered to the tail node during the capture operation.

7. The charge-mode circuitry according to claim 1, wherein said controllable charge pump comprises a capacitor and switching circuitry operable to charge said capacitor prior to said capture operation and to discharge said capacitor during said capture operation so as to provide said charge packet.

8. The charge-mode circuitry according to claim 1, connected to receive a clock signal and configured to perform said capture operation based upon said clock signal.

9. A comparator comprising the charge-mode circuitry according to claim 1.

10. The comparator according to claim 9, comprising differential-input dynamic or clocked latch circuitry, such as strongARM latch circuitry, the latch circuitry connected to receive its inputs from said charge-mode circuitry, optionally from said first and second nodes of the charge-mode circuitry.

11. Analogue-to-digital converter circuitry, comprising the charge-mode circuitry according to claim 1.

12. An IC chip, comprising the charge-mode circuitry according to claim 1.

13. Analogue-to-digital converter circuitry, comprising the comparator according to claim 9.

14. An IC Chip, comprising the comparator according to claim 9.

15. An IC Chip, comprising the analogue-to-digital converter circuitry according to claim 11.

* * * * *